(12) United States Patent
Cheah et al.

(10) Patent No.: US 12,653,047 B2
(45) Date of Patent: Jun. 9, 2026

(54) COMPOSITE BRIDGES FOR 3D STACKED INTEGRATED CIRCUIT POWER DELIVERY

(71) Applicant: Intel Corporation, Santa Clara, CA (US)

(72) Inventors: Bok Eng Cheah, Gelugor (MY); Jenny Shio Yin Ong, Bayan Lepas (MY); Jackson Chung Peng Kong, Tanjung Tokong (MY); Seok Ling Lim, Kulim Kedah (MY)

(73) Assignee: Intel Corporation, Santa Clara, CA (US)

( * ) Notice: Subject to any disclaimer, the term of this patent is extended or adjusted under 35 U.S.C. 154(b) by 56 days.

(21) Appl. No.: 17/894,200

(22) Filed: Aug. 24, 2022

(65) Prior Publication Data

US 2024/0071934 A1 Feb. 29, 2024

(51) Int. Cl.
| | |
|---|---|
| *H10W 70/65* | (2026.01) |
| *H10W 70/05* | (2026.01) |
| *H10W 70/60* | (2026.01) |
| *H10W 70/68* | (2026.01) |
| *H10W 90/00* | (2026.01) |
| *H10W 90/24* | (2026.01) |
| *H10W 72/00* | (2026.01) |

(52) U.S. Cl.
CPC .......... *H10W 70/65* (2026.01); *H10W 70/05* (2026.01); *H10W 70/095* (2026.01); *H10W 70/611* (2026.01); *H10W 70/68* (2026.01); *H10W 90/00* (2026.01); *H10W 90/24* (2026.01); *H10W 72/00* (2026.01); *H10W 90/722* (2026.01); *H10W 90/724* (2026.01)

(58) Field of Classification Search
CPC . H01L 23/5381; H01L 25/0652; H01L 25/50; H01L 25/16; H01L 23/538; H01L 23/5386; H10W 70/65; H10W 20/427; H10W 70/05; H10W 70/095; H10W 70/611; H10W 70/68; H10W 90/00; H10W 90/24; H10W 72/00; H10W 90/722; H10W 90/724
See application file for complete search history.

(56) References Cited

U.S. PATENT DOCUMENTS

| | | | | |
|---|---|---|---|---|
| 2020/0035604 | A1 * | 1/2020 | Rubin | H01L 23/5383 |
| 2020/0243450 | A1 * | 7/2020 | Cho | H01L 23/5385 |
| 2020/0273839 | A1 * | 8/2020 | Elsherbini | H01L 24/13 |
| 2021/0183776 | A1 * | 6/2021 | Cheah | H01L 25/16 |
| 2021/0193616 | A1 * | 6/2021 | Cheah | H01L 23/5384 |
| 2021/0242170 | A1 * | 8/2021 | Dabral | H05K 1/111 |
| 2021/0265273 | A1 * | 8/2021 | Chang Chien | H01L 23/3675 |
| 2021/0407962 | A1 * | 12/2021 | Kim | H01L 25/0655 |

* cited by examiner

*Primary Examiner* — Eliseo Ramos Feliciano
*Assistant Examiner* — Brad A Knudson
(74) *Attorney, Agent, or Firm* — Viering, Jentschura & Partner mbB

(57) ABSTRACT

The present disclosure is directed to semiconductor packages incorporating composite or hybrid bridges that include first and second interconnect bridges positioned on a substrate and a power corridor with a plurality of vertical channels positioned on the substrate between the first and second interconnect bridges, wherein the power corridor integrally joins the first interconnect bridge to the second interconnect bridge.

14 Claims, 8 Drawing Sheets

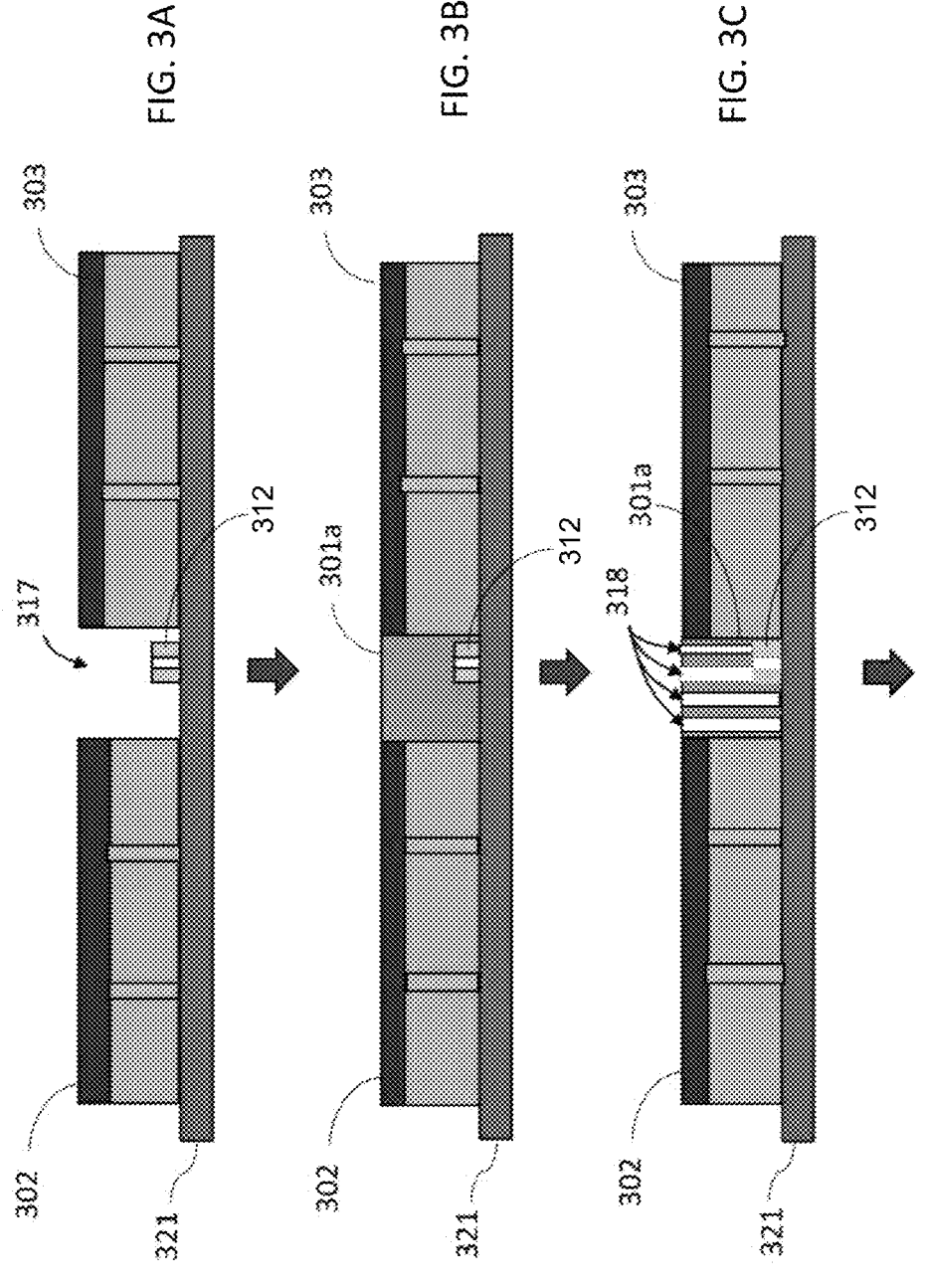

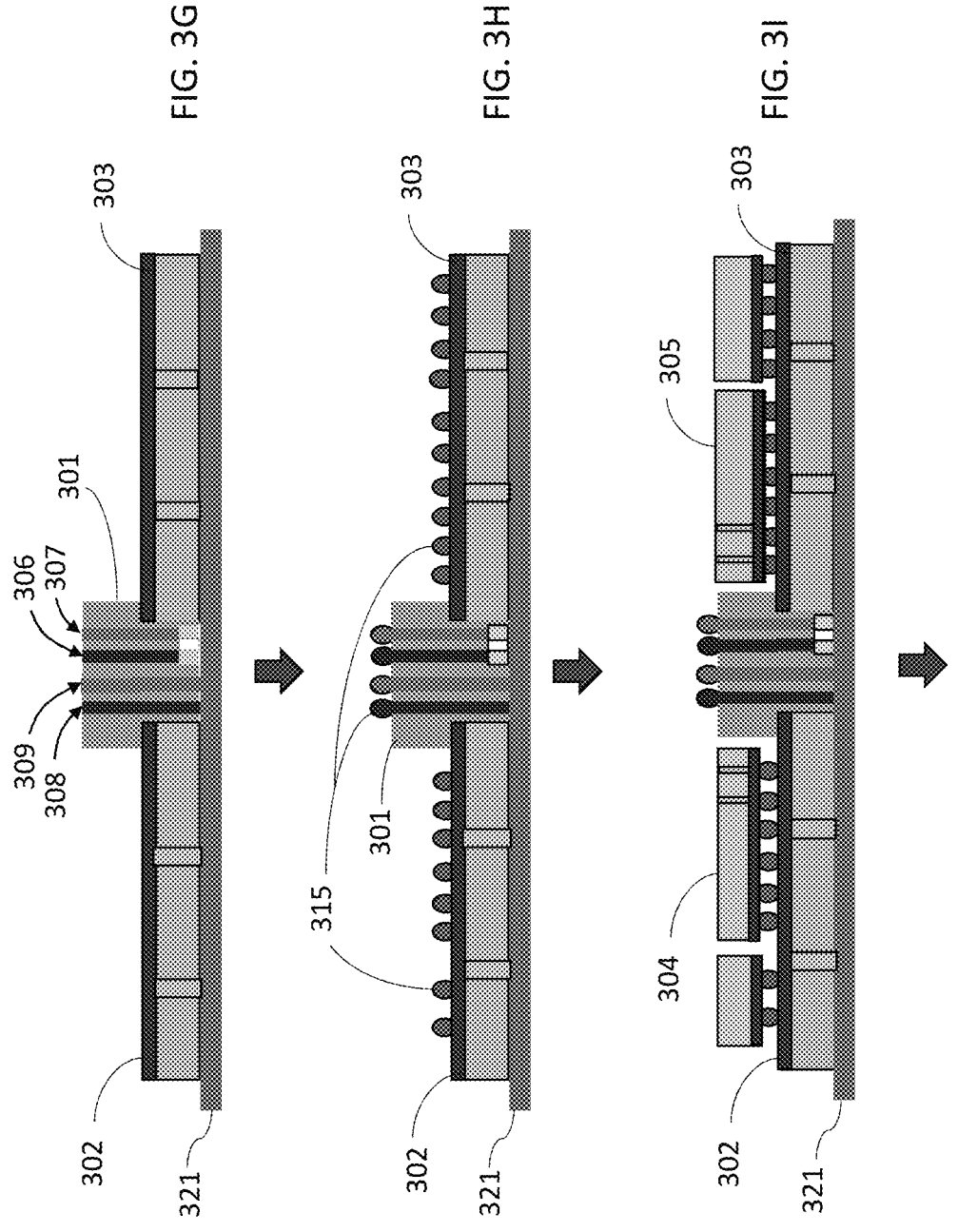

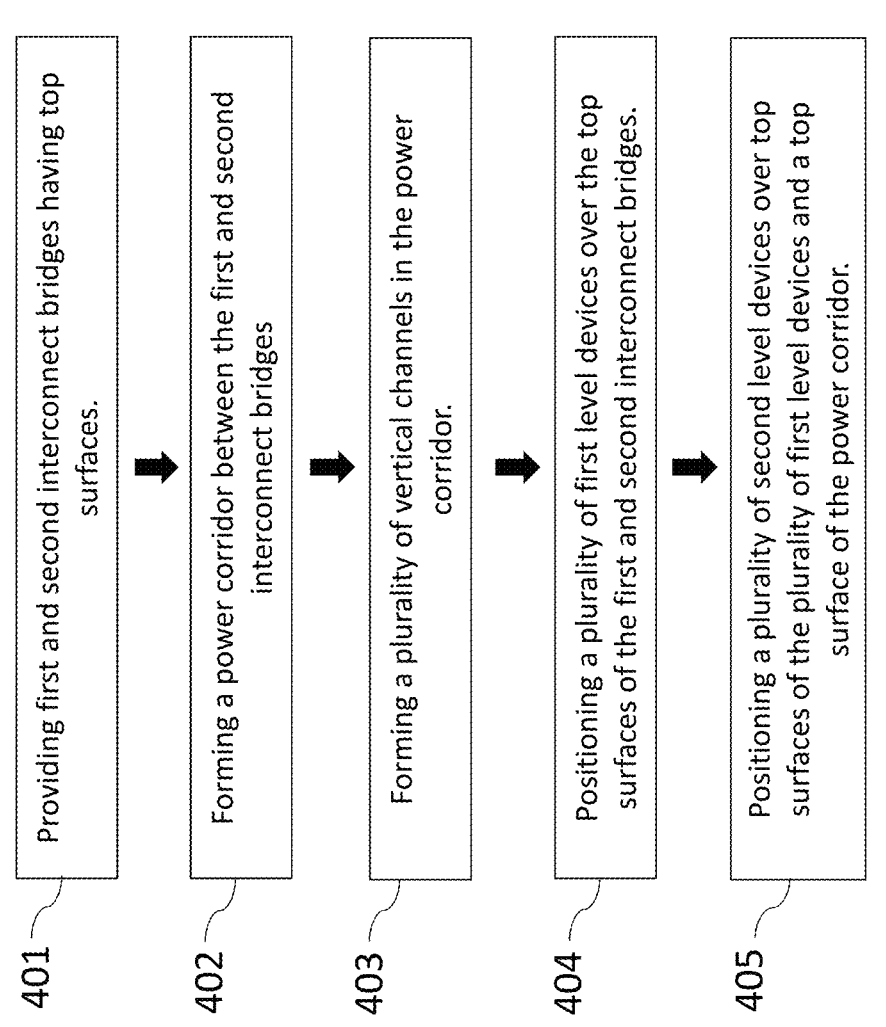

401 — Providing first and second interconnect bridges having top surfaces.

402 — Forming a power corridor between the first and second interconnect bridges 403 — Forming a plurality of vertical channels in the power corridor.

404 — Positioning a plurality of first level devices over the top surfaces of the first and second interconnect bridges.

405 — Positioning a plurality of second level devices over top surfaces of the plurality of first level devices and a top surface of the power corridor.

FIG. 4

COMPOSITE BRIDGES FOR 3D STACKED INTEGRATED CIRCUIT POWER DELIVERY

BACKGROUND

The use of advanced packaging technologies for semiconductor chips often requires two or more layers of active electronic components that are stacked together and interconnected vertically as well as horizontally to perform as a single device. One of the challenges of these 3D stacked packages is the escalating power integrity requirements for high-performance computing devices, e.g., the use of a silicon chiplet or disaggregation architecture. The reduction in the size of the packages will also require the use of stacked DRAM dies, which further necessitates the need for a robust power delivery network (PDN) to allow for cross-architecture computing solutions across all major chip types (a.k.a. XPUs) to improve processing capabilities.

In addition, the use of miniaturized interconnect geometry may result in constraints on maximum current (Imax). Imax distribution across a substrate is one of the major design factors that govern the electronic package form factor. Imax distribution may be determined by the number of solder balls required for each interface to sustain their respective workloads and the x-y dimension of a semiconductor package. In particularly, Imax constraints or limits may be caused by reduced controlled collapsed chip connection (C4) solder bump interconnects between a silicon die and a package substrate, reduced micro-bump interconnects between a stacked die/chiplet on a silicon base die or silicon interposer, and/or reduced geometry of direct vertical interconnects, e.g., through-silicon-vias (TSVs) between a stacked die/chiplet, any one of which may pose reliability risks to device functionality. Accordingly, further reductions in package substrate footprint and form-factor miniaturization, as well as improved device performance, will require addressing these power delivery concerns.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which:

FIGS. 3A through 3K show cross-sectional views of an exemplary method for assembling a semiconductor package according to an aspect of the present disclosure; and FIG. 4 shows a simplified flow diagram for an exemplary method for making a semiconductor package according to another aspect of the present disclosure.

DETAILED DESCRIPTION

Figure 1:
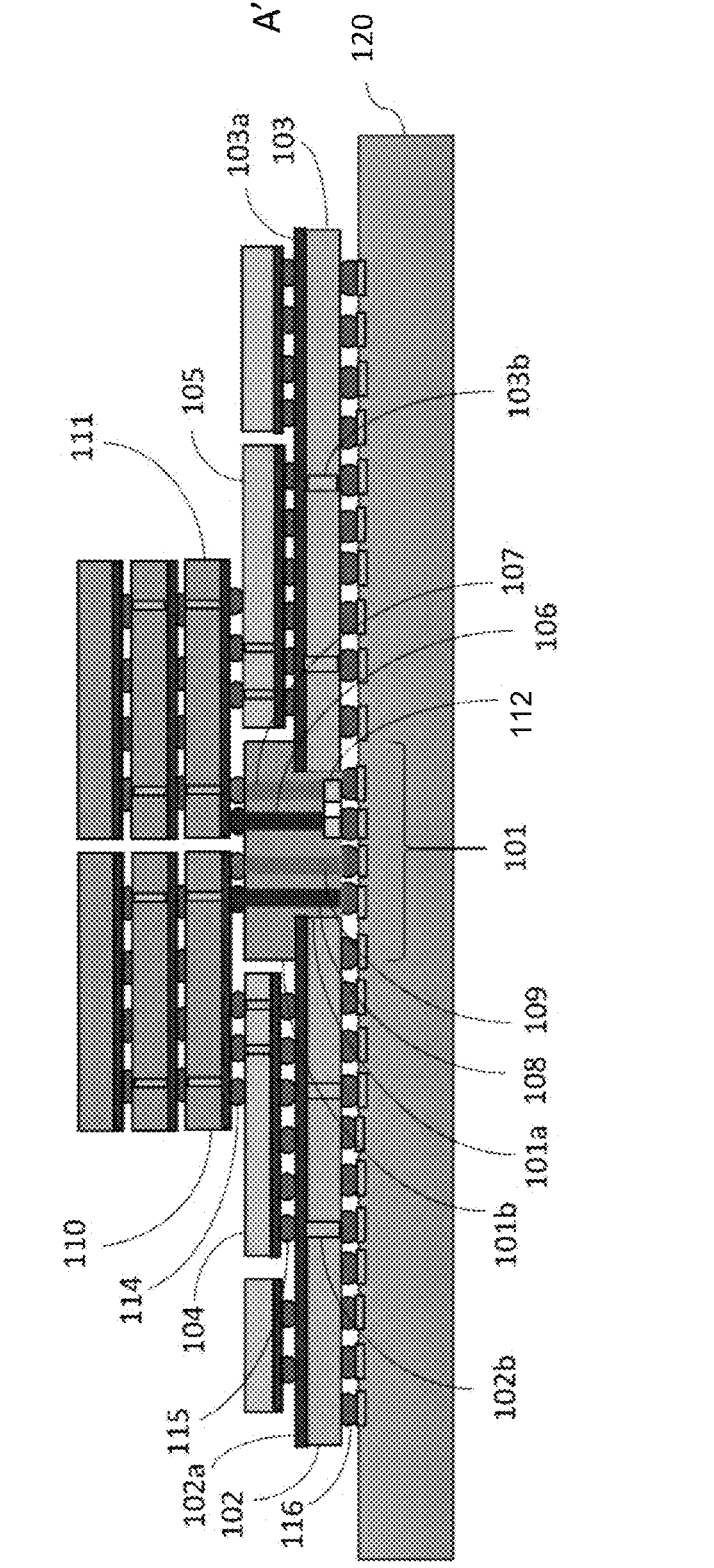
FIGS. 1 and 1A show a cross-sectional view and a top view, respectively, of an exemplary semiconductor package according to an aspect of the present disclosure.

The following detailed description refers to the accompanying drawings that show, by way of illustration, specific details, and aspects in which the present disclosure may be practiced. These aspects are described in sufficient detail to enable those skilled in the art to practice the present disclosure. Various aspects are provided for devices, and various aspects are provided for methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

In an aspect, the present disclosure is directed to a stacked semiconductor package including a first interconnect bridge and a second interconnect bridge positioned on a substrate, with a plurality of first level devices positioned over the top surfaces of the first and second interconnect bridges, a power corridor positioned on the substrate between the first and second interconnect bridges, for which the power corridor integrally joins the first interconnect bridge to the second interconnect bridge, and a plurality of second level devices at least partially positioned over a top surface of the power corridor that provides improved power delivery.

In another aspect, the present disclosure is directed to a semiconductor or electronic package having a first interconnect bridge or first bridge, a second interconnect bridge or second bridge that may be spaced apart from the first bridge by a gap that is filled with a dielectric material (e.g., an organic mold compound), which joins to the first and second bridges to form a composite bridge. The dielectric material forms a power corridor that includes a plurality of vertical interconnects, e.g., a first (Vss) interconnect and a second (Vcc) interconnect. In a further aspect, a first level of devices may be coupled to the first bridge and the second bridge, including a first base device coupled to the first bridge and a second base device coupled to the second bridge. In yet a further aspect, a first stacked device may be coupled to the first base device and a first portion of the plurality of vertical interconnects, and a second stacked device may be coupled to the second base device, and a second portion of the plurality of vertical interconnects. The plurality of vertical interconnects may facilitate power delivery from a power supply source to the first and second stacked devices according to an aspect of the present disclosure.

In yet another aspect, the present disclosure is directed to composite or hybrid bridges including first and second interconnect bridges positioned on a substrate and a power corridor with a plurality of vertical channels positioned on the substrate between the first and second interconnect bridges, wherein the power corridor integrally joins the first interconnect bridge to the second interconnect bridge.

In an aspect, the present disclosure is directed to a method of forming the present semiconductor includes forming a composite bridge by providing first and second interconnect bridges having top surfaces and forming a power corridor between the first and second interconnect bridges, for which the power corridor may be formed by an upper section and lower section, for which the upper section of the power corridor abridges the top surface of the first interconnect bridge and the top surface of the second interconnect bridge. In this aspect, the method further includes forming a plurality of vertical channels in the power corridor, positioning a plurality of first level devices over the top surfaces of the first and second interconnect bridges, for which the plurality of first level devices includes first base devices separated by the upper section of the power corridor from second bases devices, positioning a plurality of second level devices over top surfaces of the plurality of first level devices and a top surface of the power corridor, and positioning the composite bridge with the first and second level devices on a substrate.

The technical advantages of the present disclosure may include, but are not limited to:

(i) improved power delivery performance through the use of a streamlined and localized power delivery network (PDN), especially for 3D stacked die packages. Specifically, an enhanced AC loop inductance may be achieved by having a tightly coupled Vcc-Vss parallel-plane network, and reduced DC resistance may be achieved through increased power interconnects geometry (e.g., metal volume) to ameliorate the constraints of reduced interconnect geometries of C4 bumps, micro-bumps and TSVs in 3D designs;

(ii) improved device reliability through increasing the Imax capacity through a reduced DC resistance, which may be achieved through increased power interconnects geometry, that permits higher rating-power and performance for computer processors and graphic silicon devices; and (iii) providing for greater device miniaturization through a reduced silicon and/or package footprint, including, for example, a reduction of micro-bumps for 3D stacked chiplet, a reduced number of C4 bumps and/or BGA balls associated with Vcc and Vss reference voltages for both 3D and monolithic die semiconductor packages, and reduction of silicon device and/or interposer footprint, which may also lead to less package warpage.

To more readily understand and put into practical effect the present semiconductor package, and the methods for assembling the present semiconductor package, particular aspects will now be described by way of examples provided in the drawings that are not intended as limitations. The advantages and features of the aspects herein disclosed will be apparent through reference to the following descriptions relating to the accompanying drawings. Furthermore, it is to be understood that the features of the various aspects described herein are not mutually exclusive and can exist in various combinations and permutations. For the sake of brevity, duplicate descriptions of features and properties may be omitted.

Figure 1A:
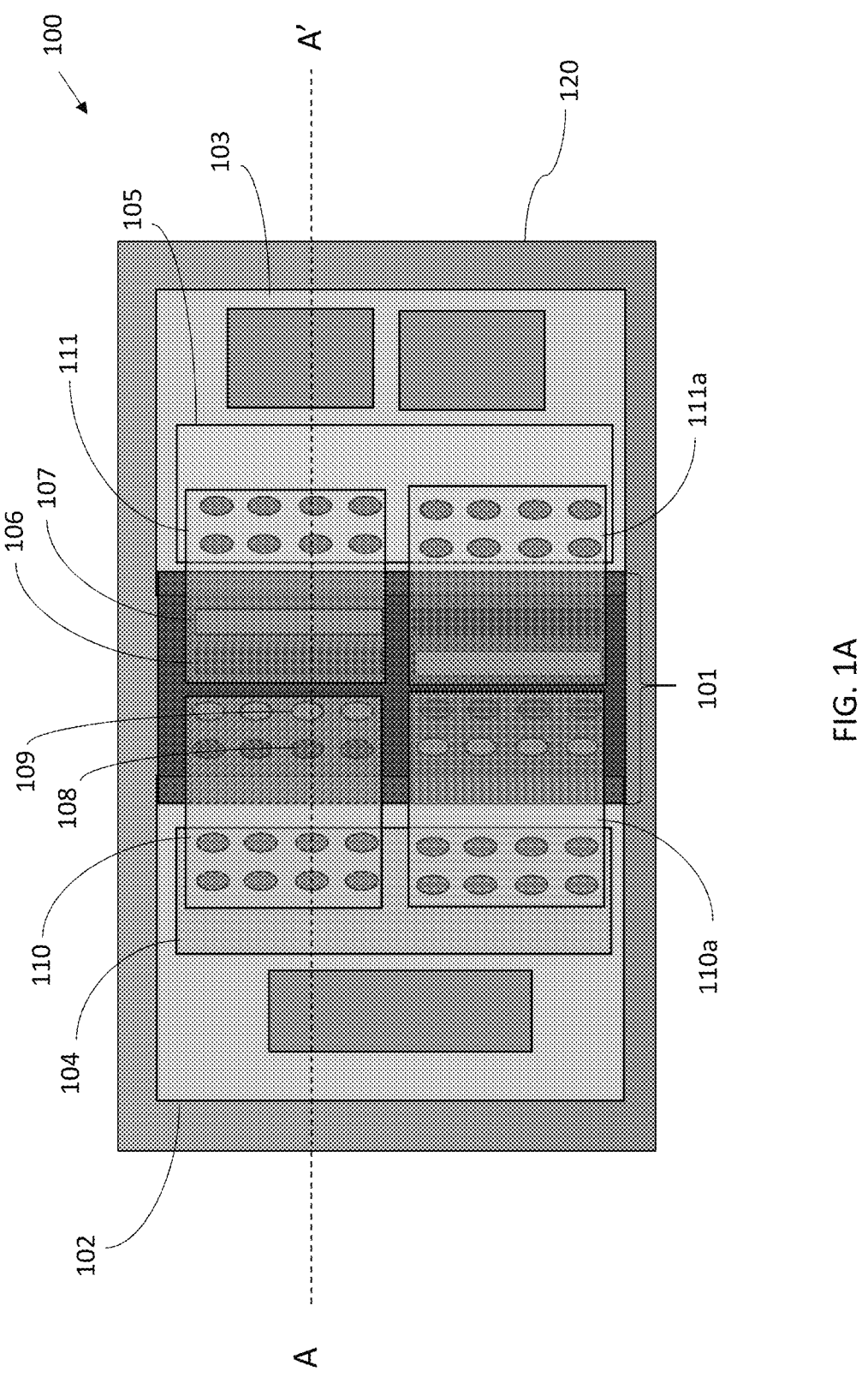

FIGS. 1 and 1A show a cross-sectional view and a top layout view, respectively, of an exemplary semiconductor package 100 according to an aspect of the present disclosure. FIG. 1 is a cross-sectional view taken along the A-A' section line shown in FIG. 1A.

In FIG. 1, the semiconductor package 100 includes an integrated power corridor 101 positioned between a first interconnect bridge 102 and a second interconnect bridge 103, which may be coupled to a substrate 120 via solder bumps 116. In an aspect, the first interconnect bridge 102 may include a first metal redistribution layer (RDL) 102a adjacent to a top surface thereof and a plurality of through silicon vias (TSVs) 102b, and the second interconnect bridge 103 may include a second metal RDL 103a adjacent to a top surface thereof and a plurality of TSVs 103b. In an aspect, the first metal RDL 102a and second metal RDL 103a may include a plurality of routing layers, respectively. In another aspect, the first and second interconnect bridges 102 and 103 may include silicon bridges, silicon interposers, embedded multi-die interconnect bridges, organic mold bridges, as well as other bridges that may be used for heterogeneous integration (i.e., multiple and different chips in the same package).

In another aspect, the power corridor 101 may have a lower section 101a, with a lower section footprint, and an upper section 101b, with an upper section footprint. The upper section footprint may be larger than the lower section footprint. As shown in FIG. 1, the upper section 101b may be positioned over the top surfaces of the first and second interconnect bridges 102 and 103. In particular, the upper section 101b may be attached to at least a portion of the first metal RDL 102a and second metal RDL 103a. In an aspect, the lower section 101a may extend along at least one of the peripheral side walls of the respective first and second interconnect bridges 102 and 103. In an aspect, the lower section 101a may be attached to at least one of the peripheral side walls of the respective first and second interconnect bridges 102 and 103. The attachment of the lower and upper sections 101a and 101b to the first and second interconnect bridges 102 and 103 forms a physically integrated composite or hybrid bridge for the semiconductor package 100.

In another aspect, the power corridor 101 includes a plurality of vertical channels 106, 107, 108, and 109 and an embedded passive component 112, e.g., a multi-layer ceramic capacitor or a silicon capacitor, which may be coupled to the vertical channels 106 and 107. In an aspect, the passive component 112 may be a resistor or an inductor. In an aspect, the power corridor may be made of a dielectric material, such as an epoxy polymer resin layer, a mold compound layer, a polyimide layer, or a silicone layer.

The plurality of vertical channels 106, 107, 108, and 109 may be configured to extend through the upper and lower sections 101a and 101b. In an aspect, the vertical channel 106 may be a vertical interconnect plate associated with a power supply voltage (Vcc) and the vertical channel 107 may be a vertical interconnect plate associated with a ground reference voltage (Vss), and as shown, the vertical channels 106 and 107 may be positioned adjacent to each other or otherwise nearby at approximately 20 to 400 microns apart. The plurality of vertical channels facilitates power delivery from a power supply source, e.g., from the substrate, to the first and second stacked devices 110 and 111.

In another aspect, the plurality of vertical channels 106, 107, 108, and 109 in the power corridor 101, the first metal RDL 102a and the plurality of TSVs 102b in the first interconnect bridge 102, and the second metal RDL 103a and the plurality of TSVs 103b in the second interconnect bridge 103 may be configured as an electrically integrated composite or hybrid bridge for the semiconductor package 100.

In an aspect, a plurality of first level devices includes a first base device 104 that may be surface mounted on the first interconnect bridge 102, and a second base device 105 that may be surface mounted on the second interconnect bridge 103 using a micro bump, solder paste or coupler 115. In an aspect, the first and second base devices may be selected from one of a central processing unit, a system-on-chip, a graphic processing unit, a neural network processor, and/or other processor devices The plurality of first level devices may additionally include a platform controller hub (PCH), an I/O tile, a deep learning processor and/or a power management integrated circuit.

In another aspect, a plurality of second level devices includes a first stacked device 110, which may be positioned abridging and coupled to the first base device 104 and a top surface of the power corridor 101, and a second stacked device 111, which may be positioned abridging and coupled to the second base device 105 and the top surface of the power corridor 101. The foregoing coupling of the first and second stacked devices 110 and 111 may be via micro bumps

5

114. In an aspect, the first and second stacked devices 110 and 111 may include one or more stacked high-bandwidth memory (HBM) devices.

In FIG. 1A, the top layout view of the semiconductor package 100 shows the power corridor 101, the first interconnect bridge 102 and the second interconnect bridge 103 positioned on the substrate 120. In addition, the first base device 104 is positioned over the first interconnect bridge 102, and the second base device 105 is positioned over the second interconnect bridge 103. As shown in FIG. 1A, there are four (4) stacked devices 110, 110a, 111, and 111a, with the stacked devices 110 and 110a abridging the first base device 104 and the power corridor 101 and the stacked devices 111 and 111a abridging the second base device 105 and the power corridor 101.

In another aspect, the vertical channels 106 and 107 in the power corridor 101 may be configured as adjacent vertical interconnect plates, i.e., a first portion of the vertical channels, and the vertical channels 108 and 109 in the power corridor 101 may be configured as vertical interconnect vias, i.e., a second portion of the vertical channels. It is within the scope of the present disclosure to configure a present semiconductor package with varying numbers of vertical interconnect vias and plates as appropriate to its design requirements. The dimensions of the vertical channel may be greater than the typical through-silicon-via by approximately two times (2×). In an aspect, the vertical channels may include a diameter ranging from 200 μm to 1 mm. In an aspect, the vertical channels may include a width and a length dimension ranging from approximately 200 μm×1 mm to 2 mm×15 mm.

Figure 2:
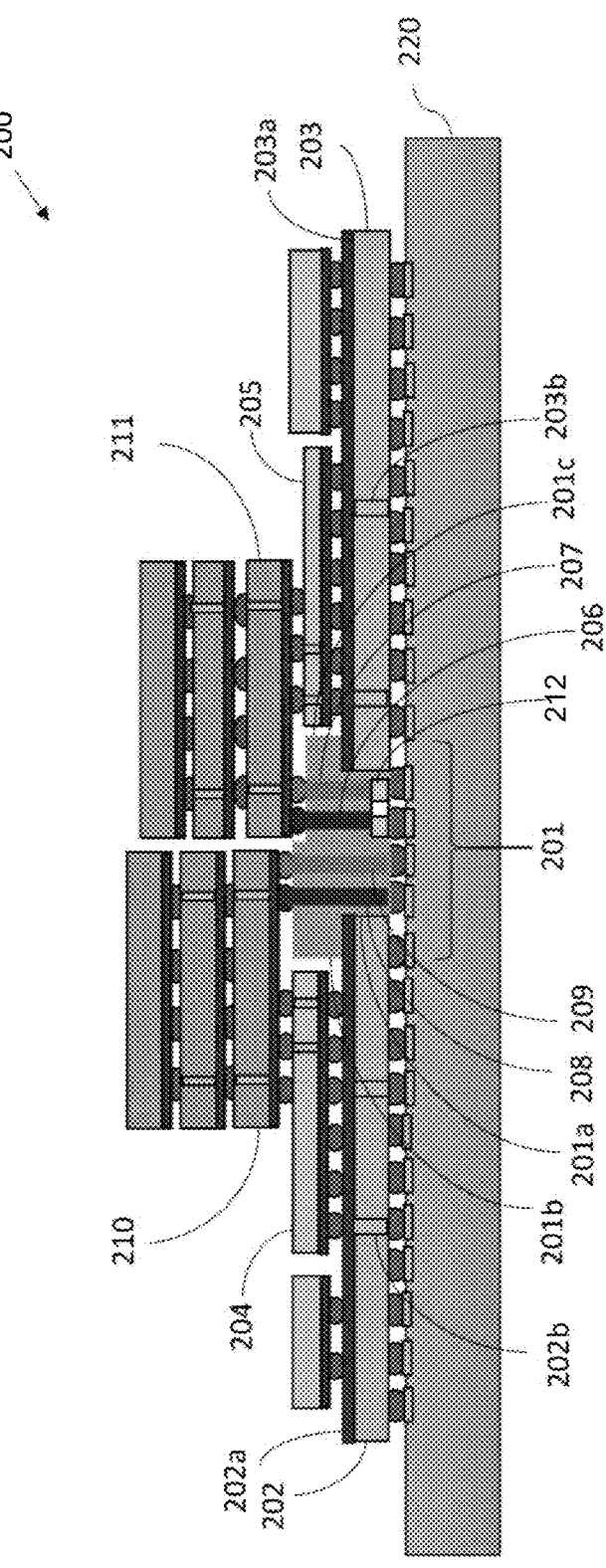
FIG. 2 shows a cross-sectional view of another exemplary semiconductor package according to an aspect of the present disclosure.

FIG. 2 shows a cross-sectional view of another exemplary semiconductor package 200 according to an aspect of the present disclosure. Similar to the aspects shown in FIG. 1, the semiconductor package 200 includes a power corridor 201 positioned between a first interconnect bridge 202 and a second interconnect bridge 203, which may be coupled to a substrate 220. In an aspect, the first interconnect bridge 202 may include a first metal RDL 202a adjacent to a top surface thereof and a plurality of TSVs 202b, and the second interconnect bridge 203 may include a second metal RDL 203a adjacent to a top surface thereof and a plurality of TSVs 203b. In an aspect, the first metal RDL 202a and second metal RDL 203a may include a plurality of routing layers, respectively.

In an aspect, a plurality of first level devices includes a first base device 204 that may be surface mounted on the first interconnect bridge 202, and a second base device 205 that may be surface mounted on the second interconnect bridge 203. In addition, a plurality of second level devices includes a first stacked device 210, which may be positioned abridging and coupled to the first base device 204 and a top surface of a first upper section 201b of the power corridor 201, and a second stacked device 211, which may be positioned abridging and coupled to the second base device 205 and a top surface of a second upper section 201c of the power corridor 201.

In another aspect, the power corridor 201 may have a lower section 201a and the first upper section 201b, and the second upper section 201c. As shown in FIG. 2, the first upper section 201b may be positioned over a top surface of the first interconnect bridge 204 and the second upper section 201c may be positioned over a top surface for the second interconnect bridge 205. In particular, the upper sections 201b and 201c may be attached to at least a portion of the first metal RDL 202a and second metal RDL 203a, respectively. In an aspect, the lower section 201a may extend along at least one of the peripheral side walls of the respective first and second interconnect bridges 202 and 203. In an aspect, the lower section 201a may be attached to at least one of the peripheral side walls of the respective first and second interconnect bridges 202 and 203. The attachment of the lower section 201a and upper sections 201b and 201c to the first and second interconnect bridges 202 and 203 forms a physically integrated composite or hybrid bridge for the semiconductor package 200. In this aspect, the second upper section 201c may have a lower height than the first upper section 201b, which forms a step portion (i.e., first and second levels), to allow the second upper section 201c to be at a similar level to the second base device 205 to provide a level surface for the second stacked device 211; for example, to reduce the distance between a thermal spreader or heat sink (not shown) and the second stacked device 211 for improved thermal dissipation.

In another aspect, the power corridor 201 includes a plurality of vertical channels 206, 207, 208, and 209 and an embedded passive component 212, such as a capacitor or a silicon capacitor. In an aspect, a step portion may be formed in an upper section of a power corridor to facilitate a level surface between a first stacked device 210 and a second stacked device 211 for improved contact with a thermal spreader or heat sink (not shown) for improved thermal dissipation.

In another aspect, the plurality of vertical channels 206, 207, 208, and 209 in the power corridor 201, the first metal RDL 202a and the plurality of TSVs 202b in the first interconnect bridge 202, and the second metal RDL 203a and the plurality of TSVs 203b in the second interconnect bridge 203 may be configured as an electrically integrated composite or hybrid bridge for the semiconductor package 200.

FIGS. 3A through 3K show cross-sectional views of an exemplary method for assembling a semiconductor package 300 according to an aspect of the present disclosure.

In FIG. 3A, a first interconnect bridge 302, a second interconnect bridge 303, and a passive component 312 may be positioned on a carrier 321. The passive component may be a plurality of passive components that may be positioned in a space 317 between the first interconnect bridge 302 and the second interconnect bridge 303.

In FIG. 3B, the space 317 may be filled with a moldable dielectric material using a convention mold process, such as an injection molding process, a transfer molding process, and/or a compression molding process. The dielectric material may form a lower section 301a of a power corridor 301, as shown completed in FIG. 3G, which embeds the passive component 312.

In FIG. 3C, a plurality of vertical spaces or openings 318 may be formed in the lower section 301a using a laser or mechanical drilling processing step to remove the dielectric material. It is also possible to use reactive ion etching to form the spaces 318.

Figures 3D, 3E, 3F:
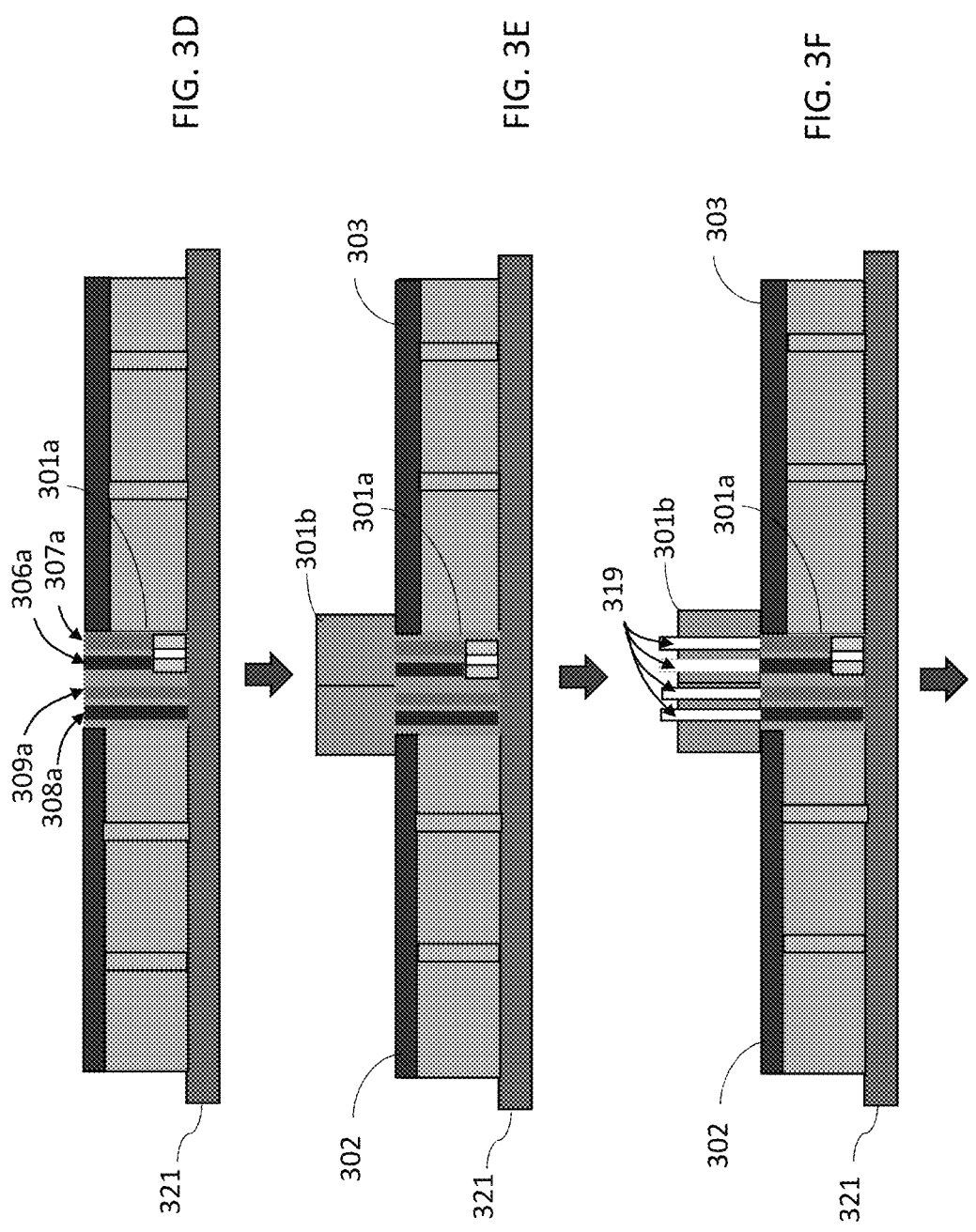

In FIG. 3D, the plurality of vertical spaces or openings 318 may be filled with a conductive material, e.g., copper or solder composites, using a conventional electrolytic deposition process, such as electroplating, or a paste printing process. The conductive material may be used to form lower segments 306a, 307a, 308a, and 309a of a plurality of vertical channels 306, 307, 308, and 309, as shown completed in FIG. 3G.

In FIG. 3E, a dielectric material (i.e., the same as used to form lower section 301a) may be used to form an upper section 301b of the power corridor 301, as shown completed in FIG. 3G. A convention mold process, such as an injection molding process, a transfer molding process, and/or a compression molding process, is used to form the upper section 301*b*.

In FIG. 3F, a plurality of vertical spaces or openings 319 may be formed in the upper section 301*b* using a second laser or mechanical drilling processing step to remove the dielectric material. It is also possible to use reactive ion etching to form the spaces 319.

In FIG. 3G, the plurality of vertical spaces or openings 319 may be filled with a conductive material, (i.e., the same as used to fill lower section 301*a*), using a conventional electrolytic deposition process, such as electroplating, or a stencil paste printing process. This deposition of the conductive material completes the formation of the plurality of vertical channels 306, 307, 308, and 309.

In FIG. 3H, a top surface of the first interconnect bridge 302, a top surface of the second interconnect bridge 303, and a top of the power corridor 301 may be provided with a plurality of solder couplers 315 using a stencil paste printing process. The solder couplers 315 on top of the power corridor 301 may be placed on the plurality of vertical channels 306, 307, 308, and 309.

In FIG. 3I, a plurality of first level devices including a first base device 304 may be surface mounted on the first interconnect bridge 302, and a second base device 305 may be surface mounted on the second interconnect bridge 303. For this step, a conventional surface mounting or thermal compression bond process may be used for coupling the plurality of first level devices.

Figures 3J, 3K:
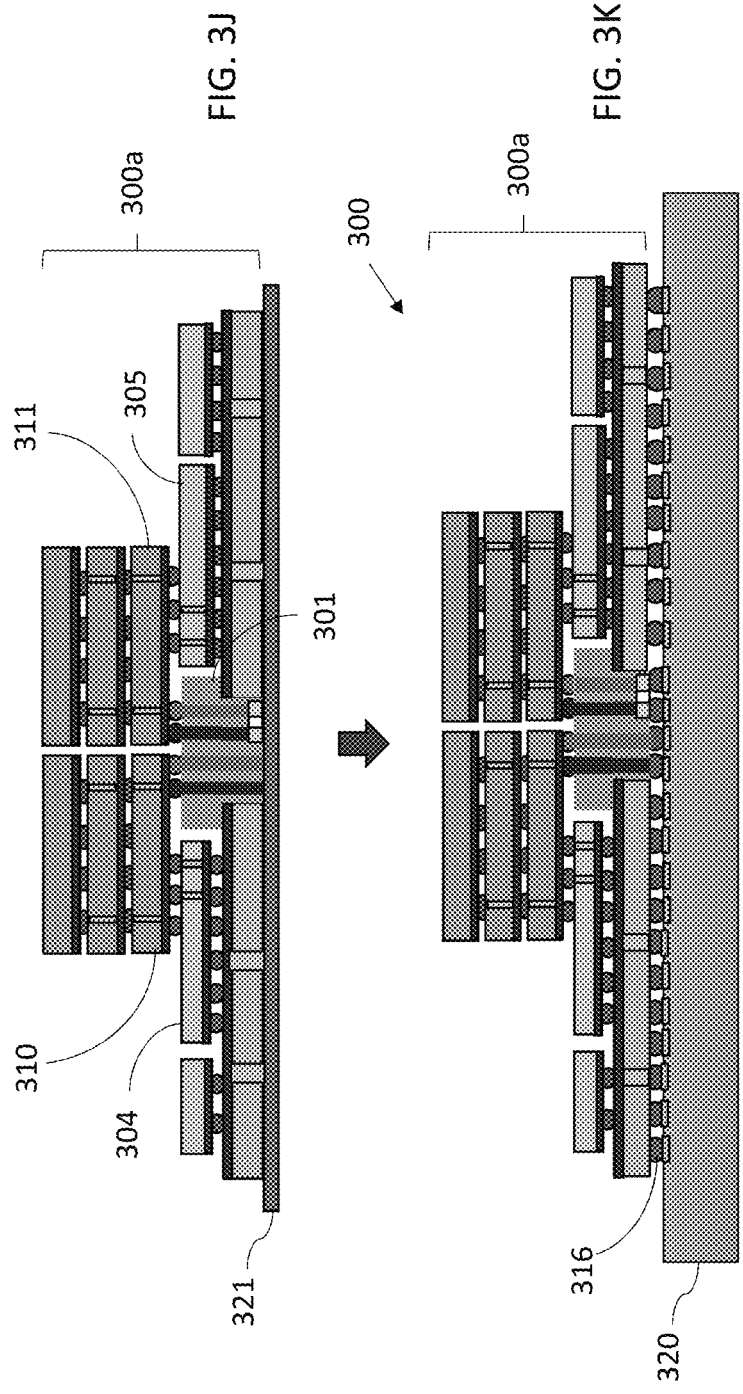

In FIG. 3J, a plurality of second level devices including a first stacked device 310, which may be positioned abridging and coupled to the first base device 304 and the top surface of the power corridor 301, and a second stacked device 311, which may be positioned abridging and coupled to the second base device 305 and the top surface of the power corridor 301. For this step, a conventional surface mounting or thermal compression bond process may be used for coupling the plurality of second level devices. The coupling of the plurality of second level devices completes the assembly of the package components or stacked module 300*a*.

In FIG. 3K, the assembly of the semiconductor package 300 may be completed by removing the package components 300*a* from the carrier 321 and coupling the package components 300*a* via a solder bump array 316 onto a substrate 320 using a conventional surface mounting or thermal compression bond process.

The foregoing assembly method and the choice of materials are intended to permit the present semiconductor package to incorporate a power corridor as part of a composite bridge. It will be apparent to those ordinary skilled practitioners that the foregoing process operations may be modified without departing from the spirit of the present disclosure.

FIG. 4 shows a simplified flow diagram for an exemplary method according to another aspect of the present disclosure. In an aspect, the present method may be able to provide a semiconductor package using the operations below.

The operation 401 may be directed to providing first and second interconnect bridges having top surfaces.

The operation 402 may be directed to forming a power corridor between the first and second interconnect bridges.

The operation 403 may be directed to forming a plurality of vertical channels in the power corridor.

The operation 404 may be directed to positioning a plurality of first level devices over the top surfaces of the first and second interconnect bridges.

The operation 405 may be directed to positioning a plurality of second level devices over top surfaces of the plurality of first level devices and a top surface of the power corridor.

It will be understood that any specific property described herein for a particular aspect of an authentication system, authentication tool, and method may also generally hold for any of the other aspects thereof described herein. It will also be understood that any specific property described herein for a specific method may generally hold for any of the other methods described herein. Furthermore, it will be understood that for any tool, system, or method described herein, not necessarily all the components or operations described will be enclosed in the tool, system, or method, but only some (but not all) components or operations may be enclosed.

To more readily understand and put into practical effect the present semiconductor package, and the methods for assembling the present semiconductor package, they will now be described by way of examples. For the sake of brevity, duplicate descriptions of features and properties may be omitted.

EXAMPLES

Example 1 provides a composite bridge including a first interconnect bridge positioned on a substrate, a second interconnect bridge positioned on the substrate, and a power corridor positioned on the substrate between the first and second interconnect bridges, for which the power corridor integrally joins the first interconnect bridge to the second interconnect bridge.

Example 2 may include the composite bridge of example 1 and/or any other example disclosed herein, for which the power corridor further includes an upper section and lower section, for which the upper section of the power corridor abridges a top surface of the first interconnect bridge and a top surface of the second interconnect bridge.

Example 3 may include the composite bridge of example 2 and/or any other example disclosed herein, for which the power corridor further includes a plurality of vertical channels that at least partially extend through the upper and lower sections of the power corridor.

Example 4 may include the composite bridge of example 1 and/or any other example disclosed herein, for which the power corridor further includes a plurality of passive components, with each of the passive components being coupled to at least one of the plurality of vertical channels.

Example 5 may include the composite bridge of example 1 and/or any other example disclosed herein, for which the first and second interconnect bridges are configured to couple the substrate with a plurality of first level devices, and the power corridor is configured to couple the substrate with a plurality of second level devices.

Example 6 provides a stacked semiconductor package including a first interconnect bridge positioned on a substrate, a second interconnect bridge positioned on the substrate, a plurality of first level devices positioned over the top surfaces of the first and second interconnect bridges, a power corridor positioned on the substrate between the first and second interconnect bridges, for which the power corridor integrally joins the first interconnect bridge to the second interconnect bridge, and a plurality of second level devices at least partially positioned over a top surface of the power corridor.

Example 7 may include the stacked semiconductor package of example 6 and/or any other example disclosed herein, for which the first and second interconnect bridges are configured to couple the substrate with the plurality of first level devices, and the power corridor is configured to couple the substrate with the plurality of second level devices.

Example 8 may include the stacked semiconductor package of example 6 and/or any other example disclosed herein, for which the power corridor further includes an upper section and lower section, for which the upper section of the power corridor abridges the top surface of the first interconnect bridge and the top surface of the second interconnect bridge.

Example 9 may include the stacked semiconductor package of example 8 and/or any other example disclosed herein, for which the upper section of the power corridor includes a top surface configured with a step portion having a first level and second level.

Example 10 may include the stacked semiconductor package of example 6 and/or any other example disclosed herein, for which the plurality of first level devices includes a first base device positioned over the top surface of the first interconnect bridge and a second base device positioned over the top surface of the second interconnect bridge.

Example 11 may include the stacked semiconductor package of example 10 and/or any other example disclosed herein, for which the first and second base devices are selected from the group comprising a central processing unit, a system-on-chip, a graphic processing unit, a neural network processor, and/or other processor devices.

Example 12 may include the stacked semiconductor package of example 6 and/or any other example disclosed herein, for which the plurality of second level devices includes a first stacked device positioned abridging and coupled to the first base device and the top surface of the power corridor, and a second stacked device positioned abridging and coupled to the second base device and the top surface of the power corridor.

Example 13 may include the stacked semiconductor package of example 12 and/or any other example disclosed herein, for which the plurality of second level devices includes one or more high-bandwidth memory devices.

Example 14 may include the stacked semiconductor package of example 8 and/or any other example disclosed herein, for which the power corridor further includes a plurality of vertical channels extending through the upper and lower sections.

Example 15 may include the stacked semiconductor package of example 14 and/or any other example disclosed herein, for which the plurality of vertical channels further includes a plurality of vertical interconnect vias and a plurality of vertical interconnect plates.

Example 16 may include the stacked semiconductor package of example 6 and/or any other example disclosed herein, for which the power corridor further includes a plurality of passive components, with each of the passive components being coupled to at least one of the plurality of vertical interconnect plates.

Example 17 may include the stacked semiconductor package of example 16 and/or any other example disclosed herein, for which the plurality of passive components includes embedded capacitors.

Example 18 provides a method including forming a composite bridge including providing first and second interconnect bridges having top surfaces, forming a power corridor between the first and second interconnect bridges, the power corridor includes an upper section and lower section, for which the upper section of the power corridor abridges the top surface of the first interconnect bridge and the top surface of the second interconnect bridge, forming a plurality of vertical channels in the power corridor, positioning a plurality of first level devices over the top surfaces of the first and second interconnect bridges, for which the plurality of first level devices includes first base devices separated by the upper section of the power corridor from second bases devices, positioning a plurality of second level devices over top surfaces of the plurality of first level devices and a top surface of the power corridor, and positioning the composite bridge with the first and second level devices on a substrate.

Example 19 may include the method of example 18 and/or any other example disclosed herein, further includes positioning a passive component between the first and second interconnect bridges and forming the power corridor over the passive component by positioning a dielectric material in a space between the first and second interconnection bridges and performing a compression mold process.

Example 20 may include the method of example 19 and/or any other example disclosed herein, for which the forming of the plurality of vertical channels further includes forming openings in the dielectric material and depositing a conductive material in the openings.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") herein may be understood as electrically coupled or as mechanically coupled, e.g., attached or fixed or attached, or just in contact without any fixation, and it will be understood that both direct coupling or indirect coupling (in other words: coupling without direct contact) may be provided.

The terms "and" and "or" herein may be understood to mean "and/or" as including either or both of two stated possibilities.

While the present disclosure has been particularly shown and described with reference to specific aspects, it should be understood by those skilled in the art that various changes in form and detail may be made therein without departing from the spirit and scope of the present disclosure as defined by the appended claims. The scope of the present disclosure is thus indicated by the appended claims and all changes which come within the meaning and range of equivalency of the claims are therefore intended to be embraced.

What is claimed is:
1. A composite bridge comprising:
a first interconnect bridge positioned on a substrate;
a second interconnect bridge positioned on the substrate; and
a power corridor positioned on the substrate vertically between the first and second interconnect bridges, wherein the power corridor integrally joins the first interconnect bridge to the second interconnect bridge, wherein the power corridor further comprises an upper section and lower section, wherein the upper section of the power corridor abridges a top surface of the first interconnect bridge and a top surface of the second interconnect bridge, wherein the power corridor further comprises a plurality of vertical channels that extends through the upper and lower sections of the power corridor, and wherein the first and second interconnect bridges are configured to couple the substrate with a plurality of first level devices, and the power corridor is configured to couple the substrate with a plurality of second level devices, through the plurality of vertical channels.

2. The composite bridge of claim 1, wherein the power corridor further comprises a plurality of passive components, with each of the passive components being coupled to at least one of the plurality of vertical channels.

3. A stacked semiconductor package comprising:
a first interconnect bridge positioned on a substrate;
a second interconnect bridge positioned on the substrate;
a plurality of first level devices positioned over top surfaces of the first and second interconnect bridges;
a power corridor positioned on the substrate vertically between the first and second interconnect bridges, wherein the power corridor integrally joins the first interconnect bridge to the second interconnect bridge; and
a plurality of second level devices at least partially positioned over a top surface of the power corridor,
wherein the first and second interconnect bridges are configured to couple the substrate with the plurality of first level devices, and the power corridor is configured to couple the substrate with the plurality of second level devices,
wherein the power corridor further comprises an upper section and lower section, wherein the upper section of the power corridor abridges the top surface of the first interconnect bridge and the top surface of the second interconnect bridge, and
wherein the power corridor further comprises a plurality of vertical channels extending through the upper and lower sections.

4. The stacked semiconductor package of claim 3, wherein the upper section of the power corridor comprises a top surface configured with a step portion having a first level and second level.

5. The stacked semiconductor package of claim 3, wherein the plurality of first level devices comprises a first base device positioned over the top surface of the first interconnect bridge and a second base device positioned over the top surface of the second interconnect bridge.

6. The stacked semiconductor package of claim 5, wherein the first and second base devices are selected from the group comprising a central processing unit, a system-on-chip, a graphic processing unit, a neural network processor, and/or other processor devices.

7. The stacked semiconductor package of claim 3, wherein the plurality of second level devices comprises a first stacked device positioned abridging and coupled to the first base device and the top surface of the power corridor, and a second stacked device positioned abridging and coupled to the second base device and the top surface of the power corridor.

8. The stacked semiconductor package of claim 7, wherein the plurality of second level devices comprises one or more high-bandwidth memory devices.

9. The stacked semiconductor package of claim 3, wherein the plurality of vertical channels further comprises a plurality of vertical interconnect vias and a plurality of vertical interconnect plates.

10. The stacked semiconductor package of claim 9, wherein the power corridor further comprises a plurality of passive components, with each of the passive components being coupled to at least one of the plurality of vertical interconnect plates.

11. The stacked semiconductor package of claim 10, wherein the plurality of passive components comprises embedded capacitors.

12. A method comprising:
forming a composite bridge comprising:
providing first and second interconnect bridges having top surfaces;
forming a power corridor vertically between the first and second interconnect bridges, the power corridor comprises an upper section and lower section, wherein the upper section of the power corridor abridges the top surface of the first interconnect bridge and the top surface of the second interconnect bridge;
forming a plurality of vertical channels in the power corridor, wherein the plurality of vertical channels extends through the upper and lower sections;
positioning a plurality of first level devices over the top surfaces of the first and second interconnect bridges, wherein the plurality of first level devices comprises first base devices separated by the upper section of the power corridor from second bases devices;
positioning a plurality of second level devices over top surfaces of the plurality of first level devices and a top surface of the power corridor; and
positioning the composite bridge with the first and second level devices on a substrate.

13. The method of claim 12, further comprises positioning a passive component between the first and second interconnect bridges and forming the power corridor over the passive component by positioning a dielectric material in a space between the first and second interconnection bridges and performing a compression mold process.

14. The method of claim 13, wherein the forming of the plurality of vertical channels further comprises forming openings in the dielectric material and depositing a conductive material in the openings.

* * * * *